(12) United States Patent
Su et al.

(10) Patent No.: US 8,145,165 B1
(45) Date of Patent: Mar. 27, 2012

(54) SPUR MITIGATION FOR WIRELESS COMMUNICATION SYSTEMS

(75) Inventors: Chi-Lin Su, Hsinchu (TW); Ning Zhang, Saratoga, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 619 days.

(21) Appl. No.: 12/335,832

(22) Filed: Dec. 16, 2008

(51) Int. Cl.
*H04B 1/06* (2006.01)

(52) U.S. Cl. .................................. 455/232.1; 455/234.1

(58) Field of Classification Search ............... 455/232.1, 455/234.1, 234.2, 296; 375/345
See application file for complete search history.

(56) References Cited

U.S. PATENT DOCUMENTS

| | | | | |
|---|---|---|---|---|
| 5,909,384 A * | 6/1999 | Tal et al. | ........................ | 708/322 |
| 6,459,404 B1 * | 10/2002 | Nussbaum et al. | ........... | 342/202 |
| 7,321,631 B1 * | 1/2008 | Choi et al. | ..................... | 375/260 |
| 7,349,503 B2 | 3/2008 | Husted et al. | | |
| 7,636,020 B1 * | 12/2009 | Hwang | .......................... | 331/16 |
| 2005/0059366 A1 | 3/2005 | Choi et al. | | |
| 2008/0123761 A1 | 5/2008 | Choi et al. | | |

* cited by examiner

*Primary Examiner* — Brian Young
(74) *Attorney, Agent, or Firm* — DeLizio Gilliam, PLLC

(57) ABSTRACT

A receiver for a wireless communication device comprising a mechanism for performing spur mitigation. An AGC unit of the receiver is operable to determine when an amplitude of an ADC output signal associated with a received RF signal is outside a predetermined amplitude range. The AGC unit is operable to modify a gain associated with a VGA such that the ADC output signal has an amplitude within the predetermined amplitude rage. The first spur mitigation unit is operable to determine an estimate of a spur signal of the ADC output signal and remove the spur signal from the ADC output signal based on the estimate of the spur signal. The first spur mitigation unit comprises a moving average filter operable to generate the estimate of the spur signal. The AGC unit is further operable to reset the moving average filter of the first spur mitigation unit when the AGC unit modifies the gain associated with the VGA.

21 Claims, 6 Drawing Sheets

SPUR MITIGATION FOR WIRELESS COMMUNICATION SYSTEMS

BACKGROUND

Embodiments of the inventive subject matter generally relate to the field of wireless communication networks, and more particularly, to techniques for spur mitigation.

Wireless communication systems can use one or more channels to transfer data between a transmitter and receivers. These communication systems can operate according to a set of standards, defined by the Institute of Electrical and Electronics Engineers (IEEE) 802.11 committee, for Wireless Local Area Network (WLAN) communication. 802.11b is a part of the IEEE 802.11 specification and defines transmission standards to increase network throughput and support bandwidths of up to 11 Mbps, by using the 2.4 GHz frequency spectrum.

SUMMARY

Various embodiments are disclosed of a receiver for a wireless communication device comprising a mechanism for performing spur mitigation. In one embodiment, the receiver comprises a variable gain amplifier (VGA), an analog-to-digital converter (ADC), an automatic gain control (AGC), and a first spur mitigation unit. The VGA is operable to change an amplitude of an RF signal received at the receiver. The ADC is operable to convert an output signal of the VGA into a digital signal. The AGC unit is operable to determine whether an amplitude of an output signal of the ADC is within a predetermined amplitude range. If the amplitude of the output signal of the ADC is outside the predetermined amplitude range, the AGC unit is operable to modify a gain associated with the VGA such that the ADC output signal has an amplitude within the predetermined amplitude rage. The first spur mitigation unit is operable to determine an estimate of a spur signal of the ADC output signal and remove the spur signal from the ADC output signal based on the estimate of the spur signal. The first spur mitigation unit comprises a moving average filter operable to generate the estimate of the spur signal. In one embodiment, the AGC unit is further operable to reset the moving average filter of the first spur mitigation unit when the AGC modifies the gain associated with the VGA.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
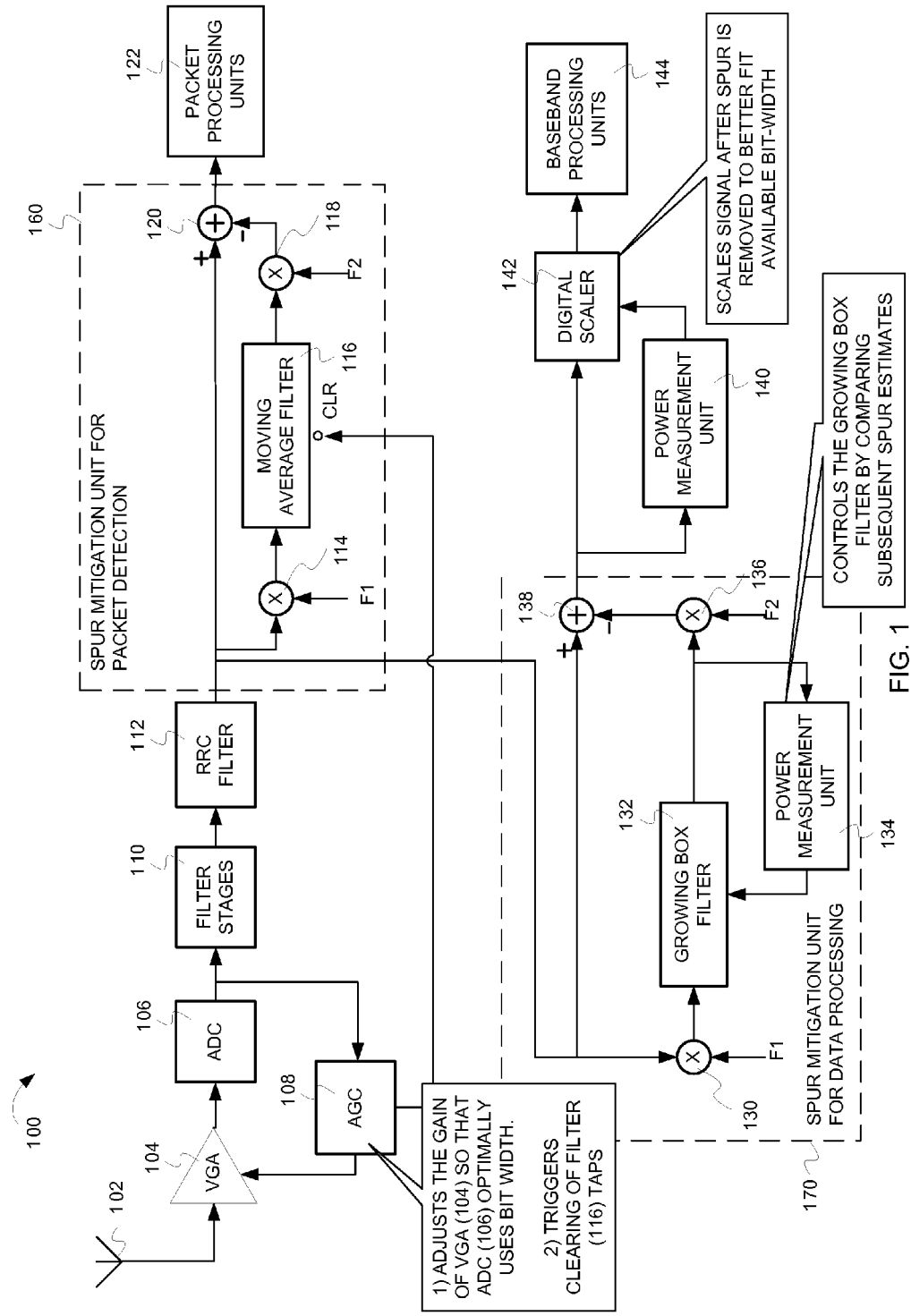
FIG. 1 is an example block diagram of a receiver unit comprising mechanisms for spur mitigation.

The description that follows includes exemplary systems, methods, techniques, instruction sequences, and computer program products that embody techniques of the present inventive subject matter. However, it is understood that the described embodiments may be practiced without these specific details. In some instances, well-known instruction instances, protocols, structures, and techniques have not been shown in detail in order not to obfuscate the description.

A transmitted radio frequency (RF) signal typically travels by multiple paths (e.g., line of sight, reflecting off one or more objects in its path, etc.) as it passes through a communication channel (e.g., free space). The transmitted signal may be corrupted by noise, interfere with other signals, and get attenuated before it is received by a receiver unit comprising one or more receiver chains. Transmitters that are designed to transmit RF signals using IEEE 802.11b standards use a complementary code keying (CCK) modulation technique defined by the 802.11b standards to support data rates of up to 11 Mbps in the 2.4 GHz frequency band. CCK is a variation of direct sequence spread spectrum techniques. A CCK modulator uses a pre-defined set of complex expressions and derives a different spreading code, depending on the information bits to be transmitted. CCK is typically used in 802.11b standards to increase the data rate of the transmitted signal.

At the receiver, to detect incoming RF signals, receiver units (comprising one or more receiver chains) may use an autocorrelation unit to detect the presence of a periodic RF signal with a pre-defined periodicity (e.g., 1 microsecond). However, the auto-correlation unit is, very often, unable to distinguish between a periodic noise signal and a desired RF signal because the auto-correlation unit can detect any periodic signal with the desired RF signal's periodicity. In other words, the auto-correlation unit can detect any signal with a periodicity of 1 microsecond or multiples of 1 microsecond. Digital clocks present on the transmitter and receiver can have harmonics with the same periodicity as the received RF signal. The autocorrelation unit may detect the harmonics of the digital clock and trigger false packet detection. These harmonics of the digital clock and other periodic noise signals that lead to false detection triggered by the autocorrelation unit are spurs. Improper detection can cause inaccuracies in timing and frequency offset estimation, incorrect decoding, and result in a degradation of receiver performance.

Spur mitigation in packet and data processing paths can help ensure that the receiver unit detects the appropriate received signal and not a periodic spur signal. Furthermore, dynamically configuring the size of filters used for spur mitigation can improve spur estimates and receiver performance. Also, the spur's power may be larger than the in-band noise power, sometimes by a factor of 10 dB. Scaling the received RF signal before and after spur mitigation to fit the available bit-width and signal levels can ensure optimal representation of the RF signal, fewer decoding errors, and better receiver performance.

FIG. 1 is an example block diagram of a receiver unit comprising mechanisms for spur mitigation. The receiver unit 100 comprises an antenna 102, a variable gain amplifier (VGA) 104, an analog to digital converter (ADC) 106, one or more filter stages 110, and a root raised cosine (RRC) filter 112. The output of the ADC 106 is also fed to an automatic gain control (AGC) unit 108, which in turn, controls the VGA 104.

The output of the RRC filter 112 is coupled with a spur mitigation unit for packet detection 160 and a spur mitigation unit for data processing 170. In the spur mitigation unit for packet detection 160, the output of the RRC filter is multiplied, using multiplier 114, with frequency F1. A moving average filter 116 uses the output of the multiplier 114 to determine a spur amplitude estimate in a preamble portion of the received signal. Additionally, the AGC unit 108 is also coupled with the moving average filter 116. Multiplier 118 then multiplies the output of the moving average filter 116 with frequency F2, thus shifting the estimated spur back to its spur frequency. Adder 120 subtracts the spur (output of the multiplier 118) from the signal (output of the RRC filter 112). Subsequent packet processing units 122 further process the output of the adder 120.

In the spur mitigation unit for data processing 170, the output of the RRC filter is multiplied, using multiplier 130, with frequency F1. A growing box filter 132 uses the output of the multiplier 130 to determine a spur amplitude estimate in a data portion of the received signal. Multiplier 136 then multiplies the output of the growing box filter 132 with frequency F2, thus shifting the estimated spur back to its spur frequency. Additionally, a power measurement unit 134 also receives the output of the growing box filter 132, computes the power of the estimated spur, and controls the length of the growing box filter 132. Adder 138 subtracts the spur (output of the multiplier 136) from the signal (output of the RRC filter 112). A digital scalar (142) scales the output of the adder 138 based on a power measurement from power measurement unit 140. Subsequent baseband processing units 122 further process the output of the digital scalar 142.

The antenna 102 receives RF signals and provides the received RF signals to the variable gain amplifier (VGA) 104. The VGA typically varies its gain depending on a control signal (e.g., control voltage) applied. The automatic gain control (AGC) unit 108 provides this control voltage and varies the control voltage depending on the amplitude of the received RF signal and the maximum bit-width of the ADC 106. The AGC 108 directs the VGA 104 to increase or decrease the applied gain such that the received RF signal (including the spur) optimally fits the ADC's available bit-width. After the ADC quantizes the received RF signal and converts a continuous analog signal into a discrete digital signal, the digitized signal goes through one or more filter stages 110. In some implementations, a Fast Fourier Transform (FFT) unit may convert the time domain signal into a frequency domain signal. The root raised cosine filter 112 is a pulse shaping matched filter that can be used in 802.11b circuitry to minimize inter-symbol interference (ISI) and the effects of noise on the received signal. A root raised cosine filter with the same response (as RRC filter 112) is also used at the transmitter to shape the response of the transmitted signal. At the receiver, the RRC filter 112 has the same response as the RRC filter at the transmitter. The RRC filter 112, therefore, filters the received signal such that the filtered signal has the same response as the transmitted signal. Also, the overall filter response, taking into account the transmitter, channel, and receiver, is that of a raised cosine filter, which can result in received signals with little or no ISI. Therefore, using a matched RRC filter may help ensure a received RF signal with maximum SNR (signal to noise ratio) and minimum ISI. In some implementations, a matched RRC filter may not be used at the transmitter and the receiver. The transmitter and the receiver may comprise any suitable filters to obtain the desired frequency response.

The output of the RRC filter 112 comprises one or more spur signals. Also, any received RF signal comprises a preamble and a payload. The preamble comprises training symbols, which can be used for channel estimation, frequency offset correction, timing offset correction, etc., and the payload comprises data symbols. The preamble and the payload can be processed separately. As shown in FIG. 1, the spur mitigation unit for packet detection 160 processes the preamble while the spur mitigation unit for data processing 170 processes the payload.

In the spur mitigation unit for packet detection 160, multiplier 114 shifts the received RF signal to DC (0 Hz). In FIG. 1, F1 represents a conjugate of a phase slope at the spur frequency ($f_{spur}$) which is represented as $e^{-j2\pi f_{spur}t}$. The moving average filter 116 processes the shifted RF signal at the output of the multiplier 114 and filters out part of the RF signal that is not the spur. The output of the moving average filter 116 is an estimate of the spur's amplitude and phase. Multiplier 118 shifts the spur estimate back to its original spur frequency (represented by F2) by multiplying the spur estimate by $e^{j2\pi f_{spur}t}$. The adder 120 subtracts the shifted spur estimate (at the output of the multiplier 118) from the received RF signal (at the output of the RRC filter 112). Subsequent packet processing units 122 process the RF signal after the spur is removed. Subsequent packet processing units can comprise a CCK demodulator, a timing and frequency correction unit, a channel estimation unit, etc.

In the spur mitigation unit for data processing 170, multiplier 130 shifts the received data signal to DC (0 Hz). As described earlier, F1 represents a conjugate of the phase slope at the spur frequency ($f_{spur}$) which is represented as $e^{-j2\pi f_{spur}t}$. The growing box filter 132 processes the shifted data signal at the output of the multiplier 130 and filters out a part of the data signal that is not the spur. The growing box filter 132 progressively processes an increasing number of samples of the data signal. The output of the growing box filter 132 is an estimate of the spur. The power measurement unit 134 determines the power of the current and previous spur estimates, compares the two measurements, and determines whether the power of the previous spur estimate is greater than the power of the current spur estimate. The power measurement unit 134 controls the length of the growing box filter 132. Multiplier 136 shifts the spur estimate back to its original spur frequency (represented by F2) by multiplying the spur estimate by $e^{j2\pi f_{spur}t}$. The adder 138 subtracts the shifted spur estimate (at the output of the multiplier 136) from the received RF signal (at the output of the RRC filter 112). Power measurement unit 140 computes the power of the RF signal (after the spur is removed) and the digital scalar 142 scales the RF signal, to better fit the available bit-width, based on the computed RF signal power. Subsequent baseband processing units 144 can comprise a CCK demodulator, a deinterleaver, a decoder, and other digital components depending on the encoding applied before transmission.

Although, FIG. 1 is depicted as comprising only one receiver chain, the receiver unit 100 can include any suitable number of receiver chains. The outputs of the multiple receiver chains can be combined using maximum ratio combining techniques (MRC) to combine the outputs from various receiver chains, to determine information symbols.

Figure 2:
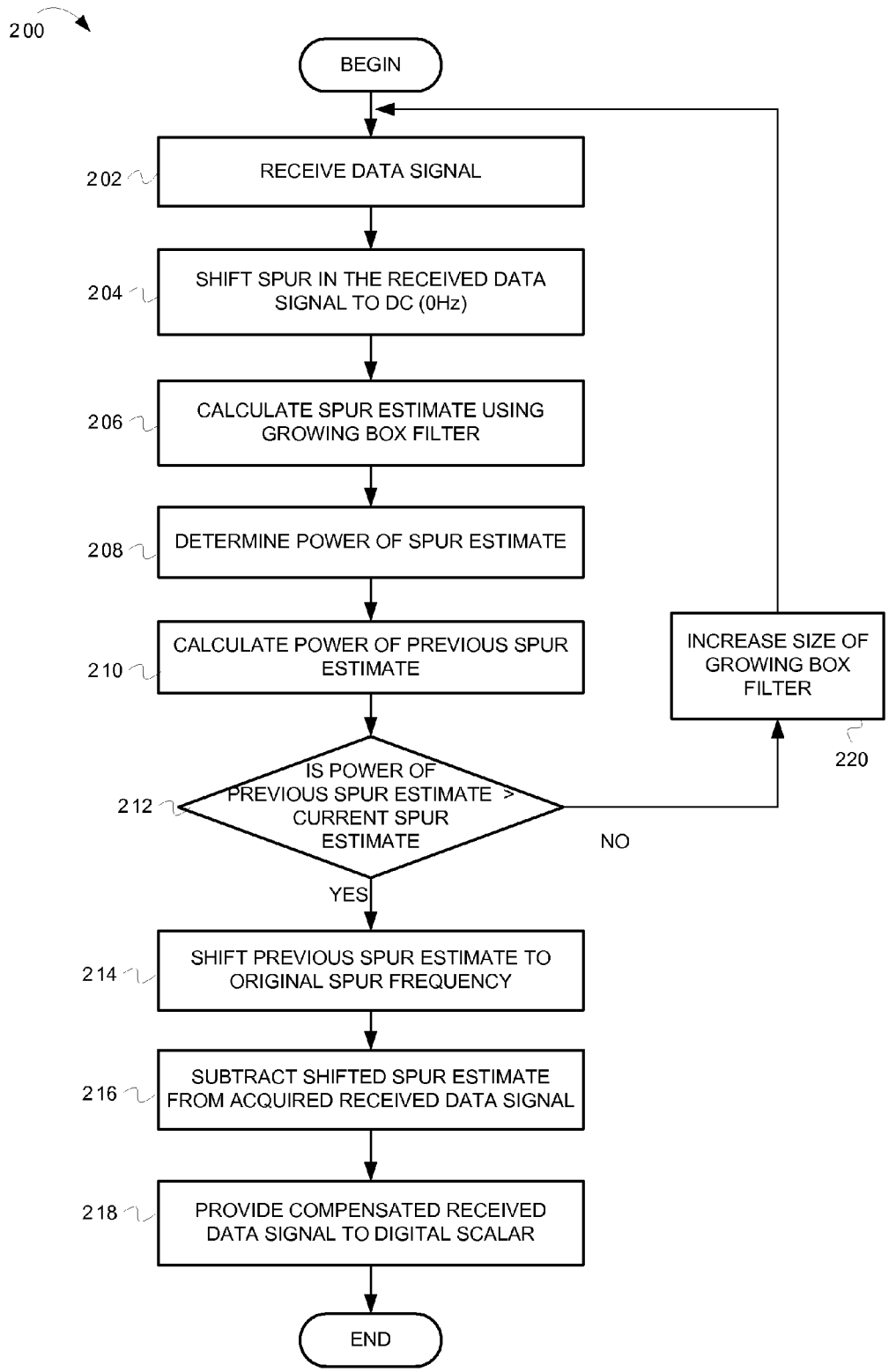
FIG. 2 is a flow diagram illustrating example operations for spur mitigation in data processing.

FIG. 2 is a flow diagram illustrating example operations for spur mitigation in data processing. The flow 200 begins at block 202.

At block 202, a data signal is received by a spur mitigation unit for data processing, e.g., spur mitigation unit for data processing 170 of FIG. 1. A received signal typically comprises two parts—a preamble and a payload. The preamble comprises training symbols, which are used in packet detection, while the payload comprises data symbols. In some implementations, the data signal can refer to the payload portion of the received signal. The data signal may be acquired from an ADC unit, one or more filter stages, or any suitable processing unit. In some implementations, an AGC unit may process the data signal before the signal is provided to the spur mitigation unit for data processing. The flow continues at block 204.

At block 204, a spur in the data signal is shifted to DC (0 Hz). Spurs typically occur at harmonics of a digital clock frequency. In some instances, a frequency generator (e.g., local oscillator) may generate the spurs. Shifting the spur frequency to DC (0 Hz) allows for easier estimation of spur amplitude. Shifting the spur frequency to DC also allows a low-pass filter to filter out all parts of the data signal that are not the spur. The data signal comprises the spur at the spur frequency. The spur in the data signal can be shifted to DC by multiplying the data signal by a conjugate of the spur frequency, e.g., via multiplier 130. Eq. 1 represents the operation of shifting the spur in the received data signal to DC.

$$y = (h*x) + n + Ae^{j[(2\pi f_{spur}t)+\varphi]}$$
$$y \cdot e^{j2\pi f_{spur}t} = [(h*x) + n] \cdot e^{-j2\pi f_{spur}t} + Ae^{j\varphi} \quad \text{Eq. 1}$$

In Eq. 1, y, h, x, and n respectively represent the data signal, channel estimates, transmitted signal, and additive noise. The spur amplitude, frequency, and phase are respectively represented by A, $f_{spur}$, and $\varphi$. After this operation, the spur (represented by $Ae^{j\varphi}$) is at DC (i.e., has no frequency component) and comprises an amplitude and phase component. The flow continues at block 206.

At block 206, a spur estimate is calculated using a growing box filter. The growing box filter can be considered to be an expandable low pass filter. The growing box filter can comprise an accumulator that progressively accumulates and processes an increasing number of samples as symbols from the data signal are received. The growing box filter can determine the spur estimate by calculating an average of samples of the received data symbols. The flow continues at block 208.

At block 208, a power of the spur estimate is determined. For example, the power measurement unit 134 can determine the power of the spur estimate. The power of the spur estimate can be used to determine whether the growing box filter has accurately estimated the spur amplitude. In other words, by calculating the power of the spur estimate, it can be determined whether the growing box filter has removed part of the spur along with the data signal. As described earlier, the spur comprises an amplitude and phase component and is represented by $Ae^{j\varphi}$. The spur estimate is a complex quantity and therefore, the power of the spur estimate (at the output of the growing box filter) can be described using Eq. 2. In Eq. 2, $P_{spur}$, $Im(P_{spur})$, and $Real(P_{spur})$ represent the power of the spur estimate, imaginary component of the spur estimate, and real component of the spur estimate respectively. The flow continues at block 210.

$$P_{spur} = \sqrt{(Real(P_{spur}))^2 + (Im(P_{spur}))^2} \quad \text{Eq. 2}$$

At block 210, a power of a previous spur estimate is calculated. For example, the power measurement unit 134 can determine the power of the previous spur estimate. The power of the previous spur estimate from the growing box filter can be calculated using Eq. 2. In some implementations, the previous spur estimate from the growing box filter may be stored (either within the growing box filter or separately from the filter). The power of the previous spur estimate may be computed after a new spur estimate is determined. The flow continues at block 212.

At block 212, it is determined whether the power of the previous spur estimate is greater than the power of the current spur estimate. The growing box filter removes, through a series of iterations, components of the signal that are not the spur. A change (an increase or a decrease) in spur power can indicate that the growing box filter filtered out part of the spur along with the data signal. This change in the spur power can indicate that the spur frequency estimate is inaccurate and that the growing box filter is not centered on the spur frequency. In some implementations, it may be determined whether the difference between the power of the current and previous spur estimates is greater than a pre-defined threshold. In other implementations, it may be determined whether the power of the current spur estimate is within a certain percentage of the previous spur estimate. For example, if it is determined that the power of the current spur estimate is within 90% to 110% of the power of the previous spur estimate, the current spur estimate may be assumed to be an accurate estimate. In other words, if the difference between the power of the previous spur estimate and the current spur estimate is within 10% of the power of the previous spur estimate, the current spur estimate may be assumed to be an accurate estimate. If it is determined that the power of the previous spur estimate is greater than that of the current spur estimate, the flow continues at block 214. Otherwise, the flow continues at block 220.

At block 214, the previous spur estimate is shifted to the original spur frequency, e.g., via multiplier 136. A change (an increase or a decrease) in spur power can indicate that the growing box filter filtered out part of the spur along with the data signal. The previous spur estimate can be considered to be a better estimate of the spur. Therefore, the previous spur estimate is used in further spur mitigation operations. At block 204, the spur was shifted to DC to enable the growing box filter to determine a best estimate of the spur amplitude (and phase). To remove the spur from the data signal, the spur estimate should be accurately represented in the frequency domain and therefore, should be shifted to its original spur frequency. This is done, as depicted in Eq. 3, by multiplying the spur estimate from the growing box filter ($Ae^{j\varphi}$) by a phase slope representing the spur frequency $f_{spur}$ (i.e., $e^{j2\pi f_{spur}t}$). In Eq. 3, the shifted spur estimate is represented by $y_{spur}$. The flow continues at block 216.

$$y_{spur} = Ae^{j\varphi} \cdot e^{j2\pi f_{spur}t} = A \cdot e^{(j\varphi + j2\pi f_{spur}t)} \quad \text{Eq. 3}$$

At block 216, the shifted spur estimate (determined at block 214) is subtracted from the acquired data signal (received at block 202), e.g., via adder 138. This operation removes the spur from the data signal (depicted in Eq. 4). In Eq. 4, $y_{data}$, $y_{spur}$, and $y_{compensated}$ represent the received data signal, the shifted spur estimate, and the compensated data signal after spur removal respectively. The flow continues at block 218.

$$y_{compensated} = y_{data} - y_{spur} \quad \text{Eq. 4}$$

At block 218, the compensated data signal is provided to a digital scalar. After the spur is removed from the data signal, the strength of the resultant signal may be too small to be accurately represented by the original received signal quantization (performed by the ADC before spur removal). The digital scalar can be used to scale the compensated signal (after spur removal) to better fit the available bit-width. In some implementations, digital scaling may be controlled by a power measurement. The power of the resultant signal may be used to determine a scaling factor, taking into consideration processing speeds of subsequent digital processing blocks, maximum allowable signal level, etc. For example, the power measurement unit 140 can determine the power of the compensated data signal. The resultant signal can then be scaled, e.g., by the digital scalar 142, by the determined scaling factor. From block 218, the flow ends.

At block 220, the size of the growing box filter is increased. The flow 200 moves from block 212 to block 220 after it is determined that the power of the previous spur estimate is less than the power of the current spur estimate. The length of the growing box filter can depend on the accuracy of the spur estimate. An increase in spur power can indicate that the growing box filter is centered on the spur frequency. An increase in spur power can also indicate that the growing box filter is accurately removing parts of the data signal that are not the spur, without removing the spur itself. In some instances, for computational and implementation advantages, the size of the growing box filter may be increased every $2^n$ samples, where n is a positive integer. When the spur frequency estimate is accurate, the size of the growing box filter is limited only by the size of the data (i.e. payload) field in the received signal. In some implementations, the size of the growing box filter may be increased until only the shifted spur signal remains. From block 220, the flow continues at block 202.

It should be understood that the depicted flow diagram (FIG. 2) is an example meant to aid in understanding embodiments and should not be used to limit embodiments or limit scope of the claims. Embodiments may perform additional operations, fewer operations, operations in a different order, operations in parallel, and some operations differently. For example, although techniques for estimating and limiting the size of the growing box filter using power comparison are described, other techniques may also be used to estimate the size of the growing box filter. In some instances, the accuracy of the spur estimate (at the output of the filter) may be determined by determining the variance of the spur estimate. In some implementations, the growing box filter (or any suitable unit) may comprise a look-up table to determine the maximum length of the growing box filter. The length of the growing box filter can depend on the accuracy of the spur estimate and can be determined theoretically or via simulations. Functionality can be implemented to determine a spur estimate, calculate the variance of the spur estimate, and access the look-up table to determine the maximum length of the growing box filter. Functionality can also be implemented to stop computing the spur estimate when the maximum length of the growing box filter is reached.

Figure 3:
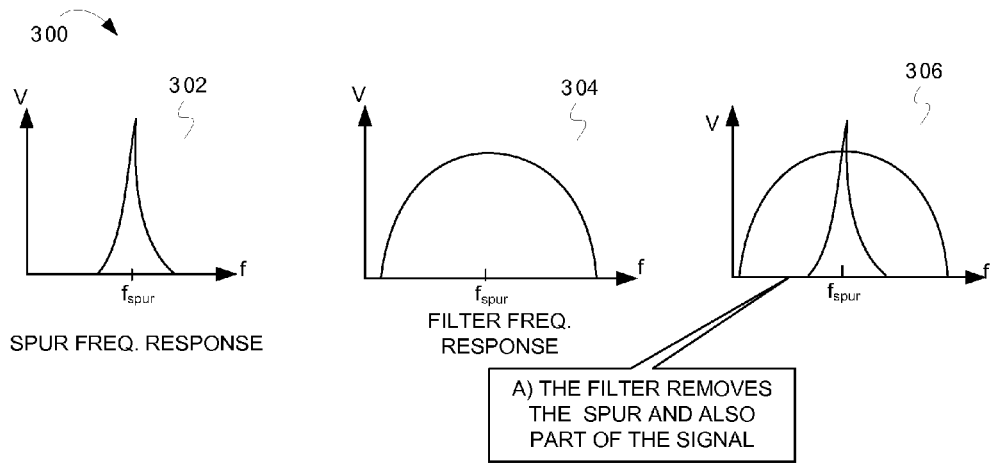
FIG. 3 is an example conceptual diagram illustrating the effect of the size of the growing box filter and accuracy of the spur estimate on spur mitigation.
Figure 3:
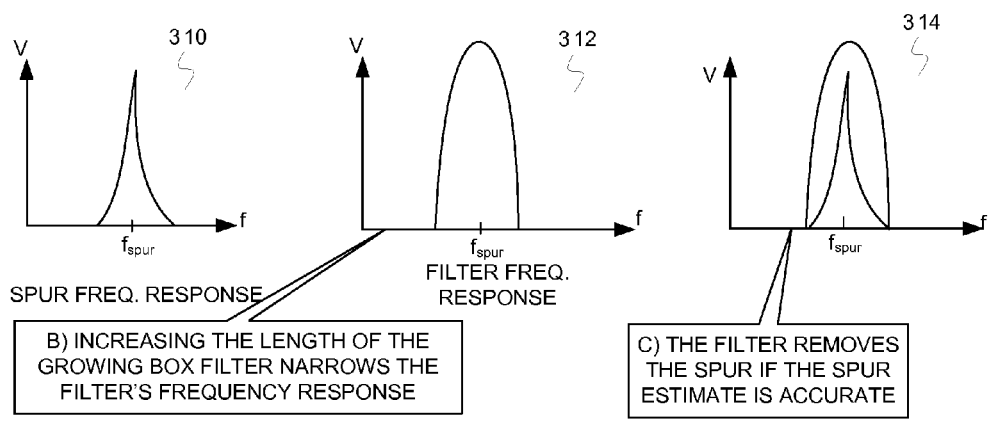
Figure 3:
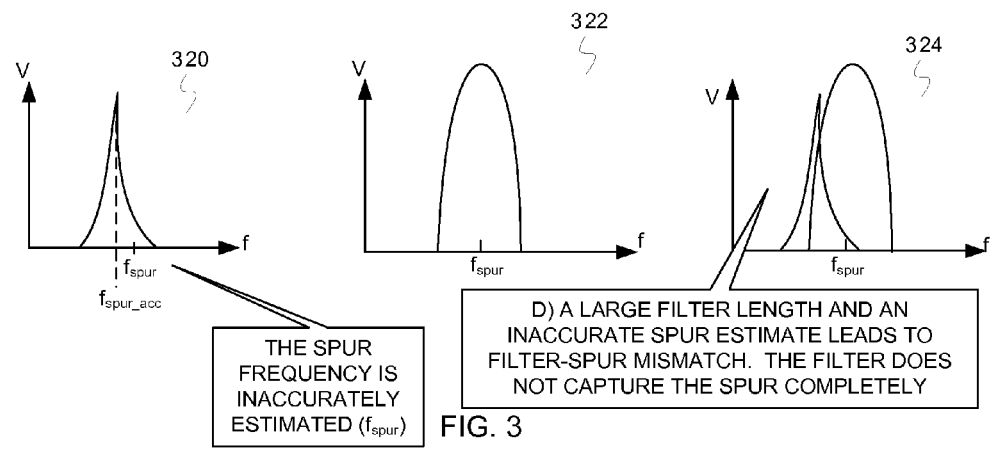

FIG. 3 is an example conceptual diagram illustrating the effect of the size of the growing box filter and accuracy of the spur estimate on spur mitigation. In FIG. 3, graph 302 depicts the frequency response of the spur with a spur center frequency $f_{spur}$. Graph 304 depicts the growing box filter's frequency response also centered on the spur frequency $f_{spur}$. Because the growing box filter begins as a filter with a short pre-defined length, the growing box filter's frequency response is wide. As shown in graph 306, the growing box filter's frequency response covers a wide range of frequencies. Therefore, as indicated in stage A, the growing box filter filters out a part of the data signal along with the spur. This can lead to a loss of information and incorrect decoding. At stage B, the length of the growing box filter is increased. This leads to a narrowing of the filter's frequency response indicated in graph 312. As indicated in graphs 312 and 314, the growing box filter is narrow and filter's frequency response is centered on the spur frequency $f_{spur}$). Therefore, at stage C, the growing box filter removes the data signal without affecting the spur. Thus, at stage C, an accurate estimate of the spur can be obtained. Graphs 320, 322, and 324 depict the effect of an inaccurate spur estimate coupled with a narrow filter response. In graph 320, the spur frequency estimate ($f_{spur}$) is incorrect. The actual spur frequency is represented by $f_{spur\_acc}$. This inaccuracy may be caused by inaccurate computations, digital errors, etc. In graph 322, the growing box filter's frequency response is narrow and the filter's frequency response is centered on the inaccurate estimate of the spur frequency ($f_{spur}$). As indicated at stage D, in graph 324, the narrowness of the growing box filter response and an inaccurate spur frequency estimate lead to a filter-spur mismatch. Therefore, the filter does not capture the spur completely. This can lead to an inaccurate spur estimate, erroneous decoding, and a reduction in receiver performance.

Figure 4:
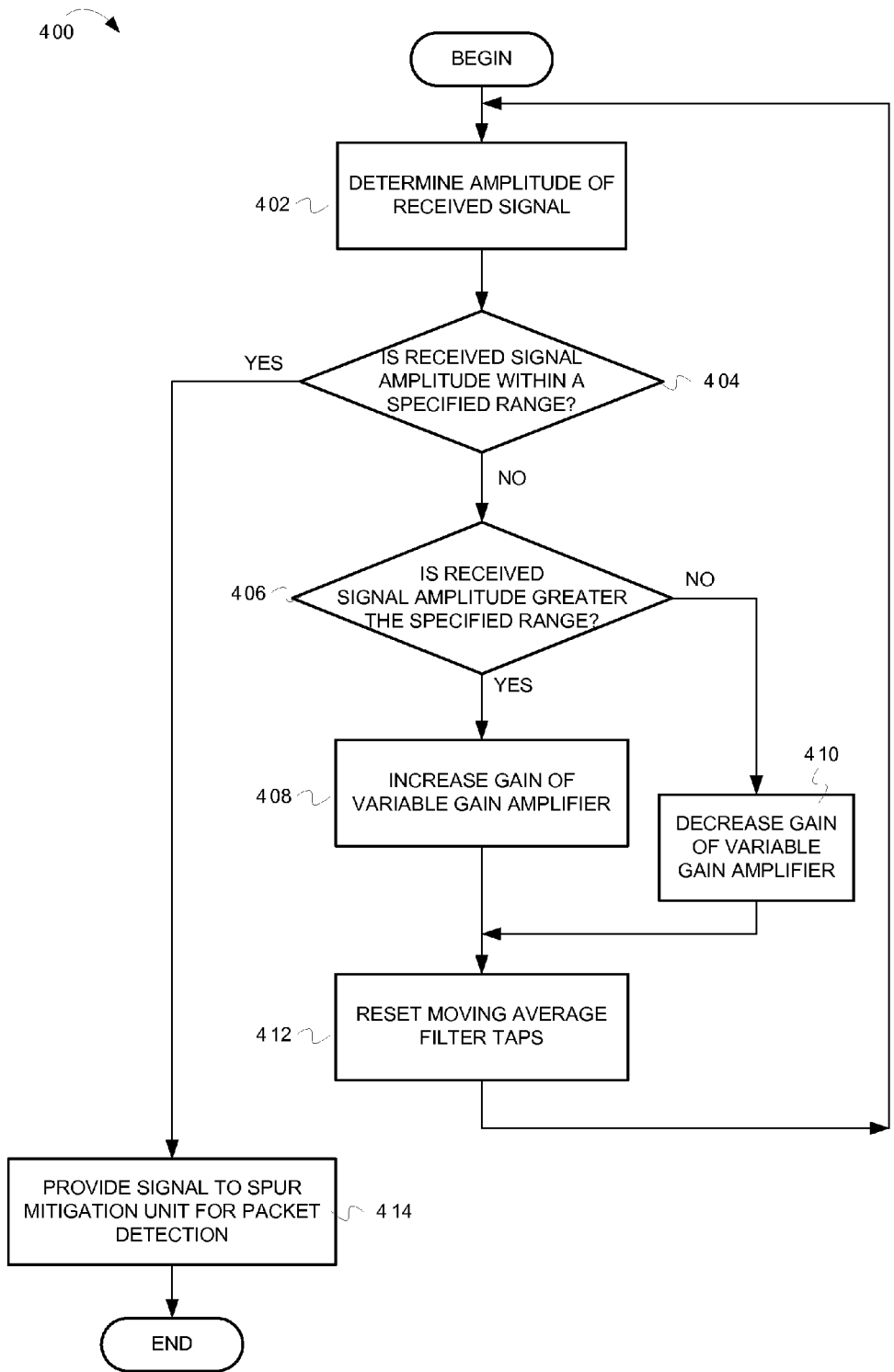
FIG. 4 is a flow diagram illustrating example operations for AGC control of spur mitigation in packet detection.

FIG. 4 is a flow diagram illustrating example operations for AGC control of spur mitigation in packet detection. The flow 400 begins at block 402.

At block 402, a received signal's amplitude is determined. The received signal may be an incoming signal from a receive antenna. In some instances, the received signal may be acquired from an amplifying unit or an ADC. The amplitude of the received signal can be determined using an envelope detector. In some implementations, the received signal's power may be computed and utilized for subsequent operations in flow 400. From block 402, the flow continues at block 404.

At block 404, it is determined, e.g., by the AGC 108, whether the received signal's amplitude is within a specified range. The specified range can be pre-determined and can be based on a maximum bit width of the ADC. In some implementations, to prevent continuous gain changes, the received signal may be monitored and scaled only if the received signal's amplitude increases or decreases beyond the specified range. For instance, the signal may not be scaled if the difference between a current measurement of the received signal's amplitude and a previous measurement of the received signal's amplitude is within, e.g., 3% of the previous measurement of the received signal's amplitude. If it is determined that the received signal amplitude is outside the specified range, the flow continues at block 406. Otherwise, the flow continues at bock 414.

At block 406, it is determined, e.g., by the AGC 108, whether the received signal amplitude is greater than the specified range. In some implementations, it may be determined whether the received signal is greater than an upper bound on the range by a threshold value, e.g., 10% of the upper bound on the range. In other implementations, the upper bound on the range may be used as a threshold. The threshold may be based on the maximum bit width of the ADC, processing capacities of subsequent processing units in the receiver chain, maximum signal levels, etc. The threshold may be a pre-determined absolute value, a percentage of the maximum signal level, etc. If it is determined that the received signal amplitude is greater than the range, the flow continues at block 408. Otherwise, the flow continues at block 410.

At block 408, the gain of the variable gain amplifier (VGA) is increased. For example, the AGC 108 may direct the VGA 104 to increase the gain applied to the received signal. Increasing the gain of the VGA and thus increasing the received signal's strength can ensure that the output of the ADC optimally uses its available bit-width. For example, before the gain of the VGA is increased, the ADC may use only half of its quantization levels to represent a very weak received signal, thus not optimally representing the signal. After the gain of the VGA is increased, the flow continues at block 412.

At block 412, taps of a moving average filter are reset, e.g., by the AGC 108. The moving average filter, e.g., moving average filter 116, is used to estimate the spur in the packet detection path. The moving average filter estimates the spur by filtering out parts of the received signal that are not the spur. Once the taps of the moving average filter are set, they are typically used throughout the operation of the filter. A change in received signal amplitude can indicate a presence of a different spur, with a different amplitude, frequency, and phase. Clearing the moving average filter's taps every time the VGA's gain is changed can ensure that the old taps do not affect the estimation of the new spur signal. Operations of the moving average filter are further described by the flow diagram in FIG. 5. From block 412, the flow continues at block 402.

At block 410, the gain of the variable gain amplifier is decreased. For example, the AGC 108 may direct the VGA 104 to decrease the gain applied to the received signal. The flow 400 moves from block 406 to block 410, after it is determined that the received signal's amplitude is less than the specified range. In some implementations, it may also be determined, e.g., by the AGC 108, whether the received signal is less than a lower range by a threshold value, e.g., 10% of the lower range bound. In other implementations, the lower range bound may be used as a threshold. Decreasing the gain of the VGA and thus decreasing the received signal's strength can ensure that the ADC is not saturated by the presence of a strong spur in the received signal and that the signal is not misrepresented. In other words, the received signal may be scaled to fit any spur in the received signal. From block 410, the flow continues at block 412.

At block 414, the received signal is provided to a spur mitigation unit for packet detection. The flow 400 moves from block 404 to block 414, after it is determined that the received signal amplitude is within the specified range, thus precluding the need for gain modifications. The spur mitigation unit for packet detection comprises functionality for removing the spurs from the received signal. Operations for spur mitigation in packet detection are further described in FIG. 5. From block 414, the flow ends.

Figure 5:
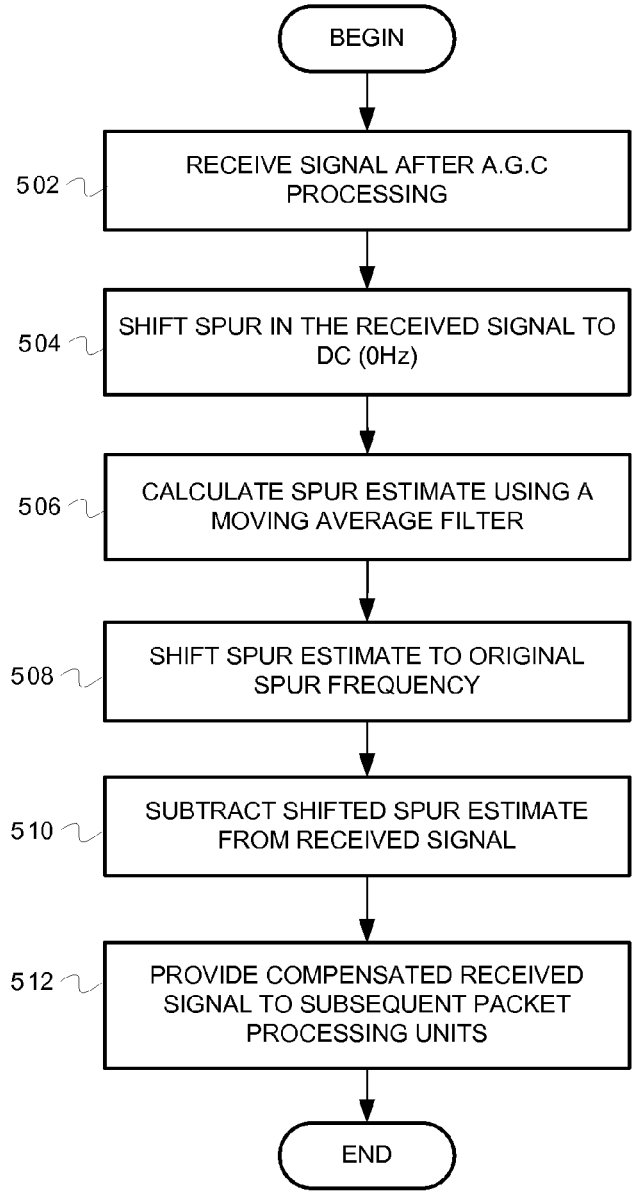
FIG. 5 is a flow diagram illustrating example operations for spur mitigation in packet detection.

FIG. 5 is a flow diagram illustrating example operations for spur mitigation in packet detection. The flow 500 begins at block 502.

At block 502, a signal is received, e.g., by the spur mitigation unit for packet detection 160 of FIG. 1, after AGC processing. In some implementations, the signal may be processed by one of more other processing units (e.g., ADC unit, filter units, etc.) after AGC processing and before being received by the spur mitigation unit for packet detection. The flow continues at block 504.

At block 504, a spur in the received signal is shifted to DC (0 Hz), e.g., via multiplier 114. Spurs typically occur at harmonics of a digital clock frequency. In some instances, a frequency generator (e.g., local oscillator) may generate the spurs. Shifting the spur frequency to DC (0 Hz) allows for easier estimation of spur amplitude. Shifting the spur frequency to DC also allows a low-pass filter to filter out all parts of the data signal that are not the spur. The spur in the received signal can be shifted to DC by multiplying the data signal by phase slope representing a conjugate of the spur frequency (i.e., $e^{-j2\pi f_{spur} t}$) as described in Eq. 1. The flow continues at block 506.

At block 506, a spur estimate is calculated using a moving average filter. For example, the moving average filter 116 can calculate the spur estimate. A moving average filter is a finite impulse response low pass filter. Unlike the growing box filter, the moving average filter does not process an increasing number of samples at every iteration. In other words, the moving average filter has a pre-determined length. The length of the moving average filter may be determined by a frequency at which the received signal is sampled, the speed of subsequent processing units, etc. At any instant, an N-tap moving average filter uses the most recent set of N sample values. The moving average output can be represented by Eq. 5, where, $y_i$(moving average) and $x_i$ are samples of the moving average output and shifted signal with the spur at DC (determined at block 504), respectively.

$$y_i(\text{moving average}) = \frac{\sum_{k=0}^{N-1} x_{i-k}}{N} \quad \text{(Eq. 5)}$$

The moving average filter removes parts of the received signal that are not the spur. Thus, the output of the moving average filter is a spur estimate (amplitude and phase). The flow continues at block 508.

At block 508, the spur estimate is shifted to the original spur frequency, e.g., via multiplier 118. At block 504, the spur was shifted to DC to enable the moving average filter to determine a best estimate of the spur. To remove the spur from the received signal, the spur estimate should be accurately represented in the frequency domain and therefore, should be shifted to its original spur frequency. This is done, as depicted in Eq. 3, by multiplying the spur estimate from the moving average filter by a phase slope representing the spur frequency $f_{spur}$ (i.e., $e^{j2\pi f_{spur} t}$) The flow continues at block 510.

At block 510, the shifted spur estimate (determined at block 508) is subtracted from the acquired received signal (received at block 502), e.g., via adder 120. This is represented in Eq. 4. The flow continues at block 512.

At block 512, the compensated received signal is provided to subsequent packet processing units. Subsequent packet processing units can include a CCK demodulator, a timing and frequency estimation and correction unit, a channel estimation unit, etc. In some instances, the compensated received signal may also be scaled to optimally represent the signal without the spur. From block 512, the flow ends.

It should be understood that the depicted flow diagrams (FIGS. 2, 4, and 5) are examples meant to aid in understanding embodiments and should not be used to limit embodiments or limit scope of the claims. Embodiments may perform additional operations, fewer operations, operations in a different order, operations in parallel, and some operations differently. For example, in some implementations, the spur frequency is assumed to be known, while in other implementations, the spur frequency can be estimated. The spur frequency can be estimated by transmitting an empty packet (i.e., a packet without a payload), via a transmitter and receiving this packet at the receiver. At the receiver, a Fast Fourier Transform (FFT) operation can be performed on the received empty packet followed by a spectral analysis of the FFT results. In the FFT spectrum, spurs are represented as spikes and depending on the accuracy of the FFT operation, an accurate estimate of the spur frequency can be obtained.

Also, in some implementations, a combination of a finite impulse response (FIR) filter and an infinite impulse response (IIR) filter ("combination FIR/IIR filter") may be used in place of the growing box filter 132 of FIG. 1. In some implementations, the frequency of the spur (e.g., digital clock) may be different from a local oscillator frequency (i.e. F1 and F2) used to shift the spur for spur mitigation operations. The combination FIR/IIR filter comprises an IIR filter, which takes an initial value from the FIR filter. Using an IIR filter can ensure a wider pass band as compared to a growing box filter. Using an initial value from the FIR filter can decrease the converging time of the IIR filter. The combination FIR/IIR filter can provide better performance as compared to the growing box filter if the estimated spur frequency (e.g., F1) is not accurate. For example, if the FIR filter is a 32 tap filter, the IIR filter starts at n=33. Eq. 6 represents the initial value of the IIR filter. Eq. 7a represents a first order IIR filter. The first output sample of the FIR filter at n=33 (y(33)) can be represented by Eq. 7b.

In Eq. 6, Eq. 7a, and Eq. 7b, x(n) represents the nth sample of data to be filtered, $y_{FIR}$ represents the output of the FIR filter, and y represents the output of the IIR filter. The weight $a_{n-1}$ applied to the previous IIR sample is a parameter, which may be used to configure a filter bandwidth. The value of $a_{n-1}$ is configurable and may depend on the desired convergence speed and noise level.

$$y_{FIR}(32) = \frac{x(1) + x(2) + \ldots + x(32)}{32} \quad \text{(Eq. 6)}$$

$$y(n) = x(n) + a_{n-1}*y(n-1); n=33, \quad \text{Eq. 7a}$$

$$y(33) = x(33) + a_{n-1}*y_{FIR}(32) \quad \text{Eq. 7b}$$

Embodiments may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, embodiments of the inventive subject matter may take the form of a computer program product embodied in any tangible medium of expression having computer usable program code embodied in the medium. The described embodiments may be provided as a computer program product, or software, that may include a machine-readable medium having stored thereon instructions, which may be used to program a computer system (or other electronic device(s)) to perform a process according to embodiments, whether presently described or not, since every conceivable variation is not enumerated herein. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions. In addition, embodiments may be embodied in an electrical, optical, acoustical or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

Figure 6:
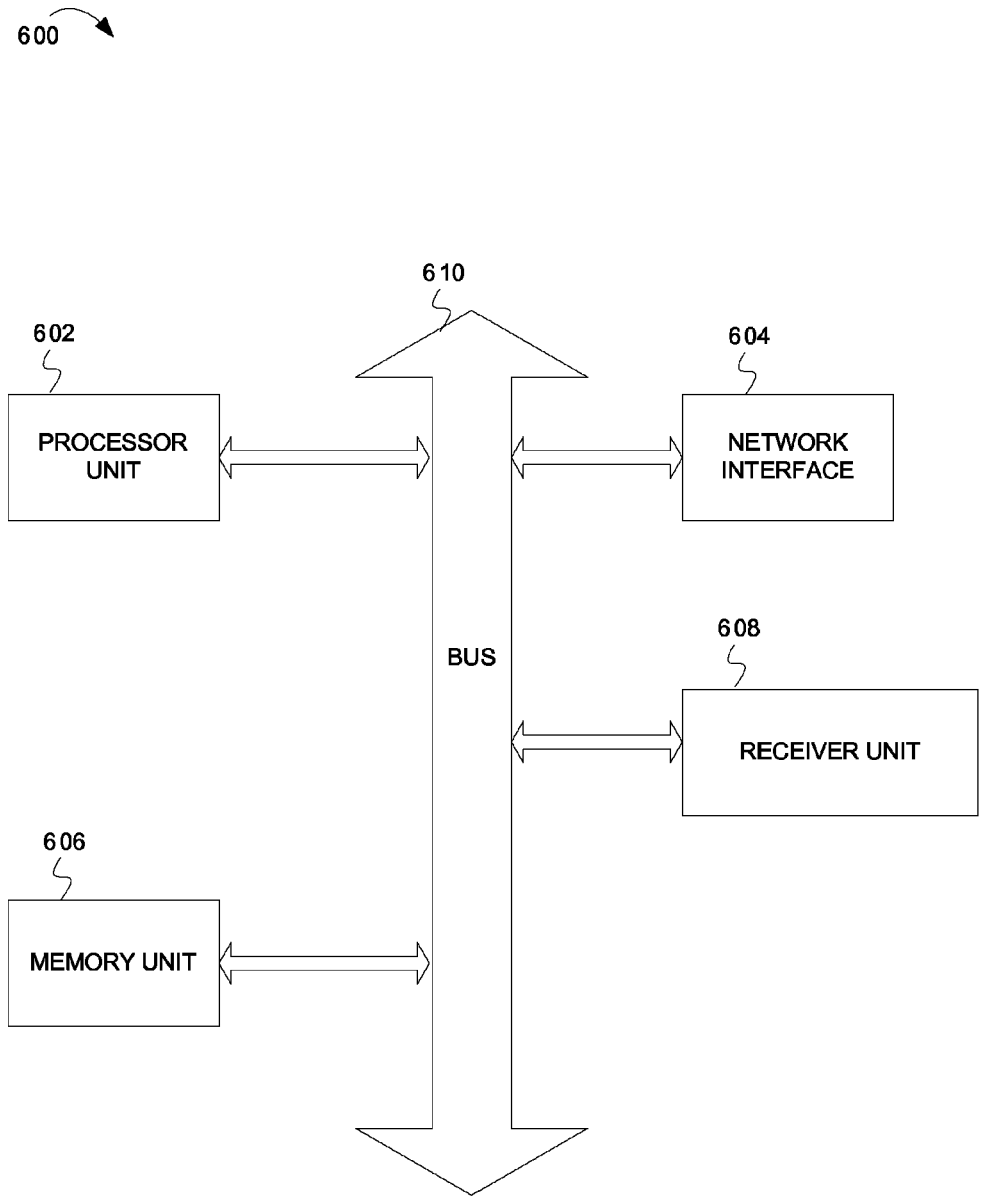
FIG. 6 is an example wireless device including a mechanism for implementing spur mitigation.

FIG. 6 depicts an example wireless device including a mechanism for implementing spur mitigation. In one implementation, the wireless device may be a WLAN device. The WLAN device includes a processor unit 602 (possibly including multiple processors, multiple cores, multiple nodes, and/or implementing multi-threading, etc.). The WLAN device includes a memory unit 606. The memory unit 606 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The WLAN device also includes a bus 610 (e.g., PCI, ISA, PCI-Express, HyperTransport®, InfiniBand®, NuBus, etc.), and network interfaces 604 that include at least one wireless network interface (e.g., a WLAN interface, a Bluetooth® interface, a WiMAX interface, a ZigBee® interface, a Wireless USB interface, etc.). The WLAN device also includes a receiver unit 608. The receiver unit 608 comprises a packet and a data processing unit each having spur mitigation functionalities described in accordance with FIGS. 1-5. The receiver unit 608 also comprises an automatic gain control (AGC) unit and a digital scalar, which controls the gain of the received signal and ensures that the signal optimally utilizes the available bit-widths. Additionally, the receiver unit 608 can also comprise one or more other processing units including a Fast Fourier Transform unit (FFT), analog to digital converter (ADC), one or more filter and amplifier stages, a decoding unit, etc. Any one of the above-described functionalities may be partially (or entirely) implemented in hardware and/or on the processing unit 602. For example, the functionality may be implemented with an application specific integrated circuit, in logic implemented in the processing unit 602, in a co-processor on a peripheral device or card, etc. Further, realizations may include fewer or additional components not illustrated in FIG. 6 (e.g., additional network interfaces, peripheral devices, etc.). The processor unit 602 and the network interfaces 604 are coupled to the bus 610. Although illustrated as being coupled to the bus 610, the memory 606 may be coupled to the processor unit 602.

While the embodiments are described with reference to various implementations and exploitations, it will be understood that these embodiments are illustrative and that the scope of the inventive subject matter is not limited to them. In general, techniques for spur mitigation as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A receiver for a wireless communication device, the receiver comprising:
   a variable gain amplifier (VGA) operable to change an amplitude of an RF signal received at the receiver;
   an analog-to-digital converter (ADC) coupled to the VGA and operable to convert an output signal of the VGA into a digital signal;
   an automatic gain control (AGC) unit coupled to the ADC and operable to determine whether an amplitude of an output signal of the ADC is within a predetermined amplitude range;
   wherein, if the amplitude of the output signal of the ADC is outside the predetermined amplitude range, the AGC unit is operable to modify a gain associated with the VGA such that the ADC output signal has an amplitude within the predetermined amplitude range; and
   a first spur mitigation unit operable to determine an estimate of a spur signal of the ADC output signal and remove the spur signal from the ADC output signal based on the estimate of the spur signal, wherein the first spur mitigation unit comprises a moving average filter operable to generate the estimate of the spur signal;
   wherein the AGC unit is further operable to reset the moving average filter of the first spur mitigation unit when the AGC unit modifies the gain associated with the VGA.

2. The receiver of claim 1, wherein the first spur mitigation unit is operable to determine the estimate of the spur signal of the ADC output signal and remove the spur signal from the ADC output signal based on the estimate of the spur signal when the amplitude of the ADC output signal is within the predetermined amplitude range.

3. The receiver of claim 1, wherein, if the amplitude of the ADC output signal is greater than the predetermined amplitude range, the AGC unit is operable to increase the gain associated with the VGA such that the ADC output signal has an amplitude within the predetermined amplitude range.

4. The receiver of claim 1, wherein, if the amplitude of the ADC output signal is less than the predetermined amplitude range, the AGC unit is operable to decrease the gain associated with the VGA such that the ADC output signal has an amplitude within the predetermined amplitude range.

5. The receiver of claim 1, wherein the first spur mitigation unit further comprises a first multiplier, a second multiplier, and an adder, wherein the first multiplier is operable to shift the ADC output signal from a first frequency to a second frequency, wherein the moving average filter is operable to receive an output signal of the first multiplier and generate the estimate of the spur signal of the ADC output signal, wherein the second multiplier is operable to shift the spur signal estimate to the first frequency, wherein the adder is operable to receive the ADC output signal and the spur signal estimate, wherein the adder is operable to subtract the spur signal estimate from the ADC output signal to remove the spur signal from the ADC output signal.

6. The receiver of claim 1, wherein the AGC unit is operable to reset taps of the moving average filter each time the AGC modifies the gain associated with the VGA.

7. The receiver of claim 1, operable to process RF signals modulated using a complementary code keying (CCK) modulation technique.

8. The receiver of claim 1, further comprising a matched root-raised cosine (RRC) filter coupled to the ADC, wherein the matched RRC filter is operable to filter the ADC output signal and provide the ADC output signal to the first spur mitigation unit and a second spur mitigation unit.

9. The receiver of claim 1, further comprising a second spur mitigation unit operable to receive the ADC output signal, wherein the second spur mitigation unit comprises:
   a growing box filter operable to determine a current estimate of a spur signal of the ADC output signal, and
   a power measurement unit operable to determine a power of the current estimate of the spur signal and a power of a previous estimate of the spur signal, wherein the power measurement unit is further operable to determine whether the power of the previous estimate of the spur signal is greater than the power of the current estimate of the spur signal;
   wherein, if the power of the previous spur signal estimate is greater than the power of the current spur signal estimate, the second spur mitigation unit is operable to remove the spur signal from the ADC output signal received at the second spur mitigation unit based on the previous spur signal estimate.

10. The receiver of claim 9, wherein, if the power of the previous spur signal estimate is less than the power of the current spur signal estimate, the power measurement unit is operable to increase the size of the growing box filter, wherein, after increasing the size of the growing box filter, the growing box filter is operable to determine a new estimate of the spur signal of the ADC output signal.

11. The receiver of claim 9, wherein the first spur mitigation unit is coupled to packet detection circuitry of the receiver and the second spur mitigation unit is coupled to data processing circuitry of the receiver.

12. The receiver of claim 9, further comprising a second power measurement unit and a digital scalar unit coupled to the second spur mitigation unit, wherein the second power measurement unit is operable to determine a power of an output signal of the second spur mitigation unit, wherein the second power measurement unit is further operable to determine a scaling factor based, at least in part, on the power of the output signal of the second spur mitigation unit, wherein the digital scalar unit is operable to scale the output signal of the second spur mitigation unit using the scaling factor provided by the second power measurement unit.

13. The receiver of claim 9, wherein the second spur mitigation unit further comprises a first multiplier, a second multiplier, and an adder, wherein the first multiplier is operable to shift the ADC output signal from a first frequency to a second frequency, wherein the growing box filter is operable to receive an output signal of the first multiplier and determine the current estimate of the spur signal of the ADC output signal, wherein, if the power of the previous spur signal estimate is greater than the power of the current spur signal estimate, the growing box filter is operable to provide the previous spur signal estimate to the second multiplier, wherein the second multiplier is operable to shift the previous spur signal estimate to the first frequency, wherein the adder is operable to receive the ADC output signal and the previous spur signal estimate, wherein the adder is operable to subtract the previous spur signal estimate from the ADC output signal to remove the spur signal from the ADC output signal.

14. A receiver for a wireless communication device, the receiver comprising:
    an analog-to-digital converter (ADC) operable to convert an RF signal received at the receiver to a digital signal;
    a spur mitigation unit operable to receive an output signal of the ADC, wherein the spur mitigation unit comprises:
       a growing box filter operable to determine a current estimate of a spur signal of the ADC output signal, and
       a power measurement unit operable to determine a power of the current estimate of the spur signal and a power of a previous estimate of the spur signal, wherein the power measurement unit is further operable to determine whether the power of the previous estimate of the spur signal is greater than the power of the current estimate of the spur signal; wherein, if the power of the previous spur signal estimate is greater than the power of the current spur signal estimate, the spur mitigation unit is operable to remove the spur signal from the ADC output signal based on the previous spur signal estimate; and a second power measurement unit and a digital scalar unit coupled with the spur mitigation unit, wherein the second power measurement unit is operable to determine a power of an output signal of the spur mitigation unit, wherein the second power measurement unit is further operable to determine a scaling factor based, at least in part, on the power of the output signal of the spur mitigation unit, wherein the digital scalar unit is operable to scale the output signal of the spur mitigation unit using the scaling factor provided by the second power measurement unit.

15. The receiver of claim 14, wherein, if the power of the previous spur estimate is less than the power of the current spur estimate, the power measurement unit is operable to increase a size of the growing box filter, wherein, after increasing the size of the growing box filter, the growing box filter is operable to determine a new estimate of the spur signal of the ADC output signal.

16. A method for implementing spur mitigation in a receiver of a wireless communication device, the method comprising:
    converting an RF signal received at the receiver of the wireless communication device into a digital signal using an analog-to-digital converter (ADC);
    providing an output signal of the ADC to a first spur mitigation unit in a packet detection circuit of the receiver and to a second spur mitigation unit in a data processing circuit of the receiver;
    at the first spur mitigation unit determining an estimate of a spur signal of the ADC output signal using a moving average filter, and
    removing the spur signal from the ADC output signal based on the estimate of the spur signal;
    at the second spur mitigation unit determining a current estimate of a spur signal of the ADC output signal using a growing box filter, determining a power of the current estimate of the spur signal and a power of a previous estimate of the spur signal using a power measurement unit, and
    if the power of the previous spur signal estimate is greater than the power of the current spur signal estimate, removing the spur signal from the ADC output signal based on the previous spur signal estimate.

17. The method of claim 16, wherein, if the power of the previous spur estimate is less than the power of the current spur estimate, increasing a size of the growing box filter, and after increasing the size of the growing box filter, determining a new estimate of the spur signal of the ADC output signal.

18. The method of claim 16, further comprising:
    determining whether an amplitude of the output signal of the ADC is within a predetermined amplitude range;
    if the amplitude of the output signal of the ADC is outside the predetermined amplitude range, modifying a gain associated with a VGA of the receiver such that the ADC output signal has an amplitude within the predetermined amplitude rage.

19. The method of claim 18, further comprising, if the amplitude of the ADC output signal is within the predetermined amplitude range, determining an estimate of the spur signal of the ADC output signal and removing the spur signal from the ADC output signal based on the estimate of the spur signal using the first spur mitigation unit.

20. The method of claim 18, further comprising resetting the moving average filter of the first spur mitigation unit when the gain associated with the VGA of the receiver is modified.

21. The method of claim 18, further comprising, if the amplitude of the ADC output signal is greater than the predetermined amplitude range, increasing the gain associated with the VGA of the receiver such that the ADC output signal has an amplitude within the predetermined amplitude range, and if the amplitude of the ADC output signal is less than the predetermined amplitude range, decreasing the gain associated with the VGA of the receiver such that the ADC output signal has an amplitude within the predetermined amplitude range.

* * * * *